United States Patent
Wong et al.

(10) Patent No.: US 11,095,263 B2
(45) Date of Patent: Aug. 17, 2021

(54) SIGNAL AMPLIFIER WITH CALIBRATED REFERENCE

(71) Applicant: Power Integrations, Inc., San Jose, CA (US)

(72) Inventors: Lance M. Wong, Milpitas, CA (US); Qing McIntosh, San Jose, CA (US); Zhao-Jun Wang, San Jose, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 16/763,694

(22) PCT Filed: Jan. 30, 2018

(86) PCT No.: PCT/US2018/015992
§ 371 (c)(1),
(2) Date: May 13, 2020

(87) PCT Pub. No.: WO2019/151992
PCT Pub. Date: Aug. 8, 2019

(65) Prior Publication Data
US 2020/0358413 A1 Nov. 12, 2020

(51) Int. Cl.
*H03F 3/45* (2006.01)
*H02M 3/335* (2006.01)
*H05B 45/3725* (2020.01)
*H05B 45/10* (2020.01)
(Continued)

(52) U.S. Cl.
CPC .... *H03F 3/45475* (2013.01); *H02M 3/33592* (2013.01); *H05B 45/3725* (2020.01); *H02M 1/0025* (2021.05); *H03F 2200/261* (2013.01); *H03F 2203/45138* (2013.01); *H05B 45/10* (2020.01); *H05B 45/382* (2020.01)

(58) Field of Classification Search
CPC ........................................................ H03F 3/45
USPC ........................................ 330/254, 260, 69
See application file for complete search history.

(56) References Cited

U.S. PATENT DOCUMENTS

| | | |
|---|---|---|
| 5,285,367 A | 2/1994 | Keller |
| 6,249,876 B1 | 6/2001 | Balakrishnan et al. |
| 6,882,212 B2 | 4/2005 | Balakrishnan |
| (Continued) | | |

FOREIGN PATENT DOCUMENTS

EP   2075910 A1   7/2009

OTHER PUBLICATIONS

International Application No. PCT/US2018/015991; The International Search Report and Written Opinion; dated Nov. 16, 2018; 13 pages.

*Primary Examiner* — Henry Choe
(74) *Attorney, Agent, or Firm* — Power Integrations, Inc.

(57) ABSTRACT

A signal amplifier for use in a power converter includes a variable reference generator coupled to generate a reference signal in response to a dimming control signal. A variable gain circuit is coupled to receive the reference signal, the gain signal, and a feedback signal representative of an output of the power converter. The variable gain circuit is coupled to output a first adjusted signal in response to the reference signal and the gain signal. The variable gain circuit is coupled to output a second adjusted signal in response to the feedback signal and the gain signal. An auxiliary amplifier is coupled to output the gain signal in response to the first adjusted signal and a set signal.

22 Claims, 5 Drawing Sheets

(51) Int. Cl.
  *H05B 45/382* (2020.01)
  *H02M 1/00* (2006.01)

(56) References Cited

U.S. PATENT DOCUMENTS

| | | | |
|---|---|---|---|
| 7,365,559 B2 | 4/2008 | Colbeck | |
| 7,564,229 B2 | 7/2009 | Odell | |
| 7,592,844 B2 | 9/2009 | Colbeck | |
| 7,675,761 B2 | 3/2010 | Cuadra et al. | |
| 7,696,817 B1 | 4/2010 | Boucher et al. | |
| 7,759,914 B2 | 7/2010 | Odell et al. | |
| 7,936,159 B2 | 5/2011 | Park et al. | |
| 8,004,262 B2 | 8/2011 | Saint-Pierre | |
| 8,040,114 B2* | 10/2011 | Saint-Pierre | G05F 1/70 323/222 |
| 8,098,503 B2 | 1/2012 | Yury et al. | |
| 8,102,164 B2 | 1/2012 | Colbeck et al. | |
| 8,242,766 B2 | 8/2012 | Yury | |
| 8,305,063 B2 | 11/2012 | Wang et al. | |
| 8,829,819 B1 | 9/2014 | Angeles et al. | |
| 8,970,302 B2 | 3/2015 | Schulz | |
| 9,071,146 B2 | 6/2015 | Matthews et al. | |
| 9,155,151 B2 | 10/2015 | Angeles | |
| 9,276,479 B2 | 3/2016 | Djenguerian et al. | |
| 9,287,784 B2 | 3/2016 | Zhang et al. | |
| 9,331,586 B2 | 5/2016 | Mao et al. | |
| 9,343,953 B2 | 5/2016 | Colbeck | |
| 9,584,017 B1 | 2/2017 | Sundararaj et al. | |
| 9,780,666 B2 | 10/2017 | Odell et al. | |
| 9,983,239 B2 | 5/2018 | Mayell | |
| 10,027,236 B1 | 7/2018 | Gaknoki et al. | |
| 10,038,439 B2 | 7/2018 | Siebler | |
| 10,101,358 B2* | 10/2018 | Cozac | G01P 21/00 |
| 10,218,282 B1 | 2/2019 | Moore et al. | |
| 10,498,300 B2 | 12/2019 | Schulz | |
| 10,811,956 B2 | 10/2020 | Moore et al. | |
| 10,819,102 B2 | 10/2020 | Mayell | |
| 2016/0278178 A1 | 9/2016 | Fang et al. | |
| 2017/0207711 A1 | 7/2017 | Balakrishnan et al. | |

* cited by examiner

SIGNAL AMPLIFIER WITH CALIBRATED REFERENCE

CROSS-REFERENCE TO RELATED APPLICATION

This application claims the benefit of International Application No. PCT/US2018/015992 filed on Jan. 30, 2018, which is incorporated in its entirety herein by reference.

BACKGROUND INFORMATION

Field of the Disclosure

The present invention relates generally to power converters, and more specifically to output sensing for power converters.

Background

Electronic devices (such as cell phones, tablets, laptops, etc.) use power to operate. Switched mode power converters are commonly used due to their high efficiency, small size, and low weight to power many of today's electronics. Conventional wall sockets provide a high voltage alternating current (ac). In a switching power converter, a high voltage ac input is converted to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

Power converters can provide a desired output quantity for a load. Some examples include a constant voltage, a constant current, constant power, etc. A power converter controller can sense output parameters of the power converter in order to maintain the desired output.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
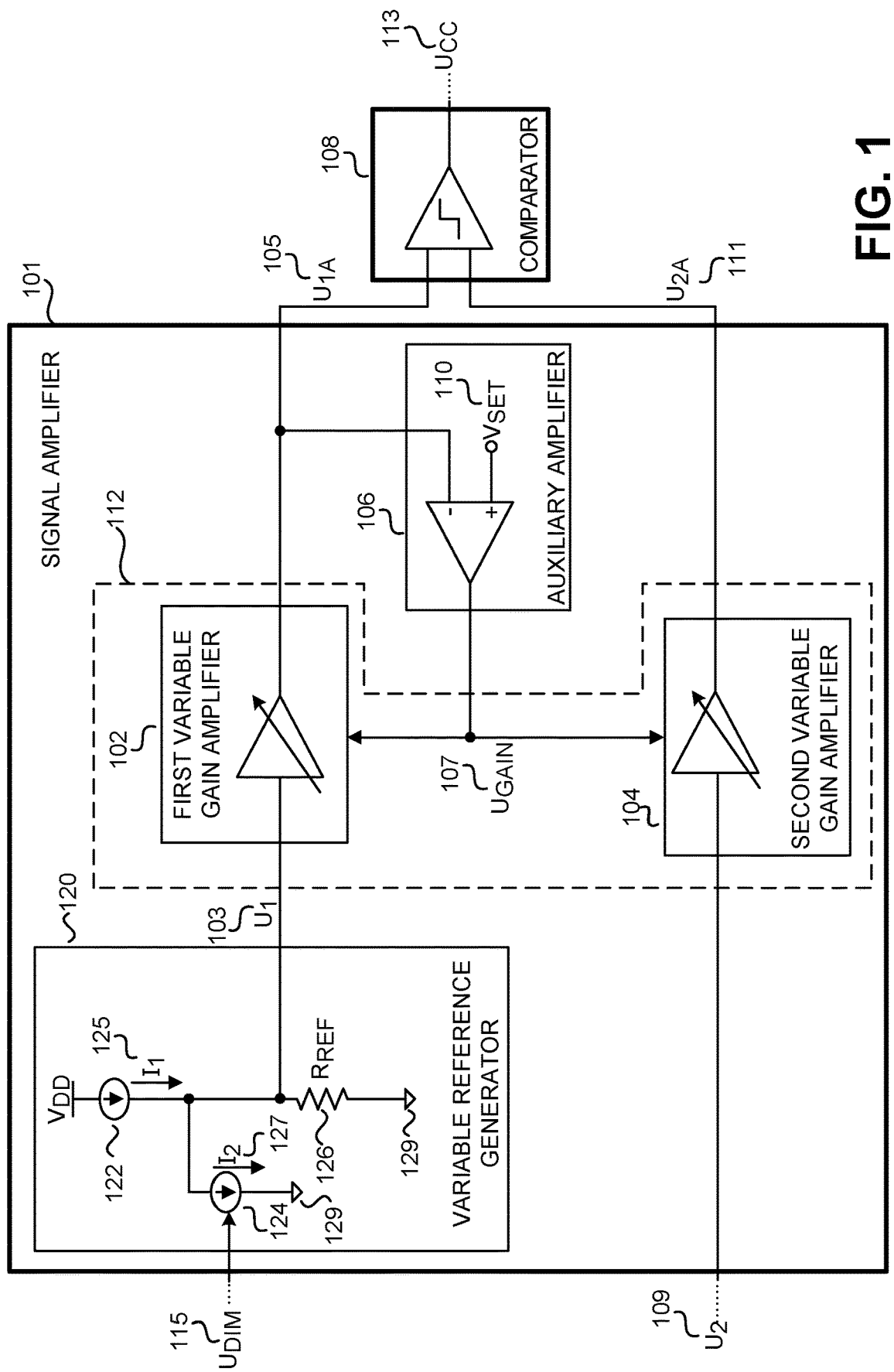
FIG. 1 is a schematic illustrating one example of a signal amplifier coupled to a comparator circuit in a controller of a power converter in accordance with an embodiment of the disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a power converter including a controller with signal amplification circuit to provide constant current regulation for a load over a wide range of constant current values are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Power converter controllers can provide constant current (CC) regulation to a load such as an LED. With constant current, the reliability of the LED load increases because the power converter can ensure the maximum current rating is not exceeded, and the brightness of the LED is matched if there is a string of LEDs. The power converter controller can sense quantities such as output voltage, output current, or combinations thereof, in order for output regulation. The signal representative of the output current can be sensed by a current sense resistor. As the brightness of the LED is reduced, the signal representative of the output current decreases accordingly. The power converter controller can use a constant current comparator to regulate the output current.

In theory, circuitry such as amplifiers and comparators do not have an input offset, but in implementations can have an input offset. At full brightness, the signals of the LED loads are greater, and the input offset of the comparator can be a small percentage error of the overall signal. However, as the brightness of the LED is reduced, the signal representative of the LED load is reduced, and the input offset can become a greater percentage error of the input signal to the comparator. Example power converter controllers in accordance with the teachings of the present invention include circuitry that can keep the percentage error of the input offset constant as the signal representative of the output current decreases. As will be discussed in the various examples in accordance with the teachings of the present disclosure, a power converter with a controller including signal amplifier to variably amplify feedback signals and sample signals for constant current comparison is utilized to provide accurate constant current regulation over a wide range of constant current levels in accordance with the teachings of the present invention.

To illustrate, FIG. 1 is a schematic illustrating one example of a signal amplifier 101 coupled to a comparator circuit 108 that is included in a controller of power converter in accordance with an embodiment of the disclosure. As shown in the depicted example, signal amplifier 101 includes a variable reference generator 120 coupled to generate a reference signal $U_1$ 103 in response to a dimming control signal $U_{DIM}$ 115. In one example, the dimming control signal $U_{DIM}$ 115 can represent a request for an increase or decrease in a dimming output, such as a LED. A variable gain circuit 112 is coupled to receive the reference signal $U_1$ 103 from variable reference generator 120, the gain signal $U_{GAIN}$ 107, and a feedback signal $U_2$ 109, which is representative of an output of the power converter. The variable gain circuit 112 is coupled to output a first adjusted signal $U_{1A}$ 105 in response to the reference signal $U_1$ 103 and the dimming control signal $U_{DIM}$ 115. The variable gain circuit 112 is also coupled to output a second adjusted signal $U_{2A}$ 111 in response to the feedback signal U2 109 and the gain signal $U_{GAIN}$ 107.

An auxiliary amplifier 106 is coupled to output the gain signal $U_{GAIN}$ 107 in response to the first adjusted signal $U_{1A}$ 105 and a set signal $V_{SET}$ 110. In one example, the set signal $V_{SET}$ 110 is a constant reference voltage that is coupled to the non-inverting input of the auxiliary amplifier 106, and the adjusted signal $U_{1A}$ 105 is coupled to the inverting input of the auxiliary amplifier 106.

As shown in the depicted example, a comparator circuit 108 included in the controller is coupled the signal amplifier 101 to compare the first adjusted signal $U_{1A}$ 105 to the second adjusted signal $U_{2A}$ 111 to output a switch request event $U_{CC}$ 113. In one example, as will be discussed for instance in greater detail in FIG. 5, the switch request event $U_{CC}$ 113 is coupled to be received by a switch request circuit that is included in a controller of a power converter to control switching of a power switch, and in some examples, a rectifier circuit, of the power converter in response to the comparison of the first adjusted signal $U_{1A}$ 105 to the second adjusted signal $U_{2A}$ 111 to regulate a constant current output in accordance with the teachings of the present disclosure.

In the illustrated example, the variable gain circuit 112 includes a first variable gain amplifier 102 coupled to receive the reference signal $U_1$ 103 and the gain signal $U_{GAIN}$ 107. The first variable gain amplifier 102 is coupled to vary a first gain or amplification of the reference signal $U_1$ 103 in response to the gain signal $U_{GAIN}$ 107 to output the first adjusted signal $U_{1A}$ 105. A second variable gain amplifier 104 coupled to receive the feedback signal $U_2$ 109 and the gain signal $U_{GAIN}$ 107. The second variable gain amplifier 104 is coupled to vary a second gain or amplification of the feedback signal $U_2$ 109 in response to the gain signal $U_{GAIN}$ 107 to output the second adjusted signal $U_{2A}$ 111.

In the example illustrated in FIG. 1, the variable reference generator 120 includes a first current source 122, which is coupled to provide a first reference current $I_1$ 125. A variable current source 124 is coupled to the first current source 122 to shunt a variable current $I_2$ 127 from the first reference current $I_1$ 125 in response to the dimming control signal $U_{DIM}$ 115. A reference resistor $R_{REF}$ 126 is coupled to the first current source 122 and the variable current source 124 to generate the reference signal $U_1$ 103 in response to a difference between the first reference current $I_1$ 125 and the variable current $I_2$ 127.

Figure 2:
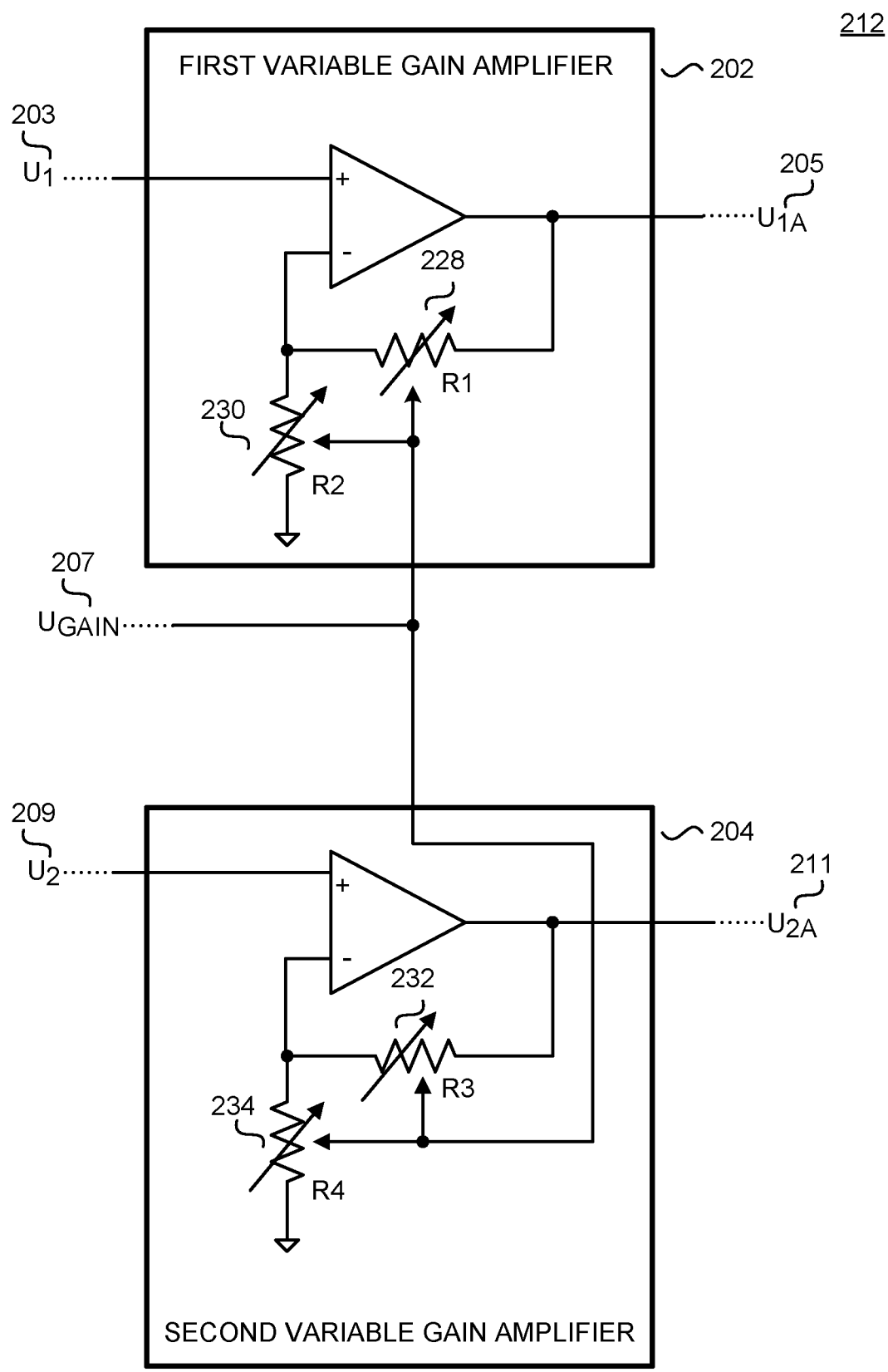
FIG. 2 is a schematic illustrating one example of variable gain circuit included in an example signal amplifier in a controller of a power converter in accordance with an embodiment of the disclosure.

FIG. 2 is a schematic illustrating one example of variable gain circuit 212 included in an example signal amplifier in a controller of a power converter in accordance with an embodiment of the disclosure. It is appreciated that variable gain circuit 212 of FIG. 2 may be one example of variable gain circuit 112 of FIG. 1, and that similarly named and numbered elements referenced below may be coupled and function similar to as described above. As will be discussed and as shown in the example depicted in FIG. 2, variable gain circuit 212 includes first variable gain amplifier 202, which includes a first operational amplifier coupled to a first voltage divider, and a second variable gain amplifier 204, which includes a second operational amplifier coupled to a second voltage divider.

The first operational amplifier includes a first input (e.g., non-inverting input) coupled to receive the reference signal $U_1$ 203, and an output coupled to generate the first adjusted signal $U_{1A}$ 205. The first voltage divider includes a first resistor R1 228 coupled to a second resistor R2 230. A first end of the first resistor R1 228 is coupled to the output of the first operational amplifier. A second end of the first resistor R1 228 is coupled to a second input (e.g., inverting input) of the first operational amplifier. In operation, a first resistance ratio (e.g., R1/R2) of the first resistor R1 228 and the second resistor R2 230 is coupled to be adjusted in response to the gain signal $U_{GAIN}$ 207 to vary a first gain of the first operational amplifier.

In the depicted example, it is noted that both the first resistor R1 228 and the second resistor R2 230 are illustrated as variable resistors for explanation purposes. In various examples, it is appreciated that the variable resistors in this disclosure may be implemented as analog or digital variable resistors. It is appreciated that in another example, one of the first resistor R1 228 and the second resistor R2 230 may be implemented as a fixed resistance resistor, and the other resistor of the voltage divider may be implemented as a variable resistor to adjust the first resistance ratio (e.g., R1/R2) of the first resistor R1 228 and the second resistor R2 230 in response to the gain signal $U_{GAIN}$ 207 to vary a first gain of the first operational amplifier in accordance with the teachings of the present disclosure.

In addition, in another example, it is appreciated that one or both of the first resistor R1 228 and the second resistor R2 230 may be implemented with circuit elements having variable resistances, such as for example transistors, MOSFETs, etc. For instance, in one example, first resistance R1 228 may be implemented with a fixed resistance resistor, while second resistance R2 230 may be implemented with a MOSFET having a gate terminal coupled to receive the gain signal $U_{GAIN}$ 207 to vary the first gain of the first operational amplifier in accordance with the teachings of the present disclosure.

The second operational amplifier includes a first input (e.g., non-inverting input) coupled to receive the feedback signal $U_2$ 209, and an output coupled to generate the second adjusted signal $U_{2A}$ 211. The second voltage divider includes a third resistor R3 232 coupled to a fourth resistor R4 234. A first end of the third resistor R3 232 is coupled to the output of the second operational amplifier. A second end of the third resistor R3 232 is coupled to a second input (e.g., inverting input) of the second operational amplifier. In operation, second resistance ratio (e.g., R3/R4) of the third resistor R3 232 and the fourth resistor R4 234 is coupled to be adjusted in response to the gain signal $U_{GAIN}$ 207 to vary a second gain of the second operational amplifier.

In the depicted example, it is noted that both the third resistor R3 232 and the fourth resistor R4 234 are also illustrated as variable resistors for explanation purposes. It is appreciated that in another example, one of the third resistor R3 232 and the fourth resistor R4 234 may be implemented as a fixed resistance resistor, and the other resistor of the voltage divider may be implemented as a variable resistor to adjust the first resistance ratio (e.g., R3/R4) of the third resistor R3 232 and the fourth resistor R4 234 in response to the gain signal $U_{GAIN}$ 207 to vary the second gain of the second operational amplifier in accordance with the teachings of the present disclosure.

In addition, in another example, it is appreciated that one or both of the third resistor R3 232 and the fourth resistor R4 234 may be implemented with circuit elements having variable resistances, such as for example transistors, MOSFETs, etc. For instance, in one example, third resistance R3 232 may be implemented with a fixed resistance resistor, while fourth resistance R4 234 may be implemented with a MOSFET having a gate terminal coupled to receive the gain signal $U_{GAIN}$ 207 to vary the second gain of the second operational amplifier in accordance with the teachings of the present disclosure.

Figure 3:
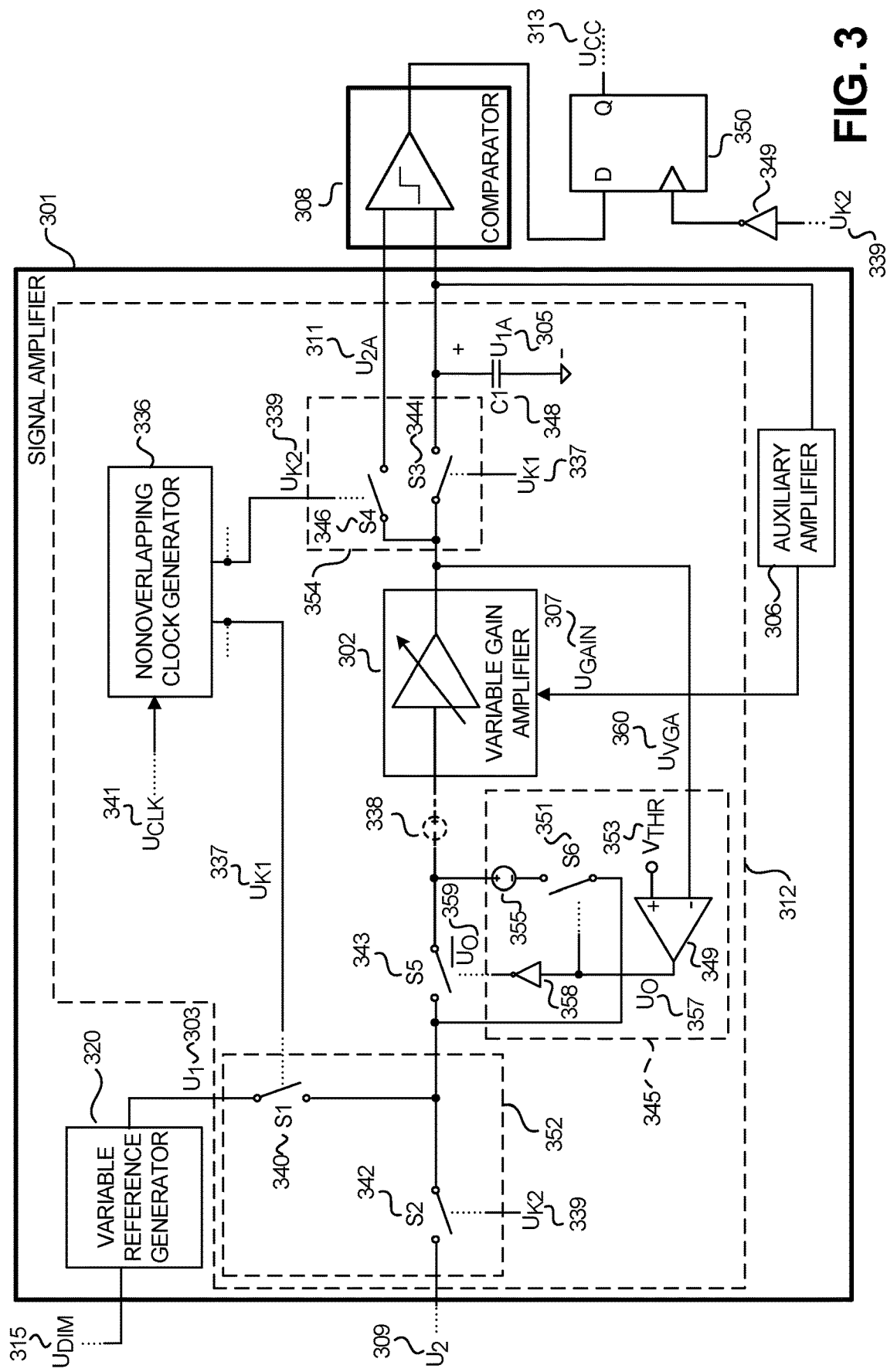
FIG. 3 is a schematic illustrating another example of a signal amplifier coupled to a comparator circuit coupled to a flip-flop in a controller of power converter in accordance with an embodiment of the disclosure.

FIG. 3 is a schematic illustrating another example of a signal amplifier 301 including a variable gain circuit 312, which is coupled to a comparator circuit 308 that is coupled to a flip-flop 350 in a controller of the power converter in accordance with an embodiment of the disclosure. It is appreciated that variable gain circuit 312 of FIG. 3 may be another example implementation of variable gain circuit 112 of FIG. 1, and that similarly named and numbered elements referenced below may be coupled and function similar to as described above. As will be described, similar to variable gain circuit 112 of FIG. 1, variable gain circuit 312 of FIG. 3 is coupled to receive a reference signal $U_1$ 303, a feedback signal $U_2$ 309, and a gain signal $U_{GAIN}$ 307, and is coupled to output a first adjusted signal $U_{1A}$ 305 in response to the reference signal $U_1$ 303 and the gain signal $U_{GAIN}$ 307, and output a second adjusted signal $U_{2A}$ 311 in response to the feedback signal $U_2$ 309 and the gain signal $U_{GAIN}$ 307 in accordance with the teachings of the present disclosure.

One difference between variable gain circuit 312 of FIG. 3 and variable gain circuit 112 of FIG. 1 is that variable gain circuit 312 of FIG. 3 includes only a single variable gain amplifier 302, which can be implemented to variably amplify both the reference signal $U_1$ 303 and the feedback signal $U_2$ 309. It is appreciated that by utilizing only the variable gain amplifier 302, the drawback of any offsets that may exist between two separate variable gain amplifiers (e.g., offsets that may exist between first variable gain amplifier 202 and second variable gain amplifier 204 of FIG. 2 such as process mismatch or the gain mismatch resistance ratio of R1/R2 versus R3/R4) are canceled out in accordance with the teachings of the present invention. As will be shown, the single variable gain amplifier 302 of FIG. 3 amplifies or gains up the reference signal $U_1$ 303 generate a first adjusted signal $U_{1A}$ 305, stores it on storage element C1 348, and then amplifies or gains up the feedback signal $U_2$ 309 at a later time generate a second adjusted signal $U_{2A}$ 311, which is then compared to the stored first adjusted signal $U_{1A}$ 305. Without the variable gain amplifier 302, the internal offset of comparator 308 can be greater than the reference signal $U_1$ 303 and feedback signal $U_2$ 309. With the variable gain amplifier 302, the first adjusted signal $U_{1A}$ 305 and the second adjusted signal $U_{2A}$ 311 are signals of higher magnitude that can reduce or eliminate the effect of any internal offset of comparator 308.

To illustrate, the example depicted in FIG. 3 shows that variable gain circuit 312 includes a nonoverlapping clock generator 336 coupled to generate a first clock signal $U_{K1}$ 337 and a second clock signal $U_{K2}$ 339 in response to a clock signal $U_{CLK}$ 341. In one example, logic high pulses of the first clock signal $U_{K1}$ 337 and logic high pulses of the second clock signal $U_{K2}$ 339 are nonoverlapping. In one example, there is also a dead time between the logic high pulses of the first clock signal $U_{K1}$ 337 and the logic high pulses of the second clock signal $U_{K2}$ 339 such that there is a time that both the first clock signal $U_{K1}$ 337 and the second clock signal $U_{K2}$ 339 are logic low between respective logic high pulses.

Continuing with the depicted example, a variable reference generator 320 is coupled to generate the reference signal $U_1$ 303 in response to the dimming control signal $U_{DIM}$ 315, and an auxiliary amplifier 306 is coupled to generate the gain signal $U_{GAIN}$ 307 in response to the first adjusted signal $U_{1A}$ 305. A first switching circuit 352 is coupled to receive the reference signal $U_1$ 303, the first clock signal $U_{K1}$ 337, the feedback signal $U_2$ 309, and the second clock signal $U_{K2}$ 339. The first switching circuit 352 is coupled to sample the reference signal $U_1$ 303 during logic high pulses of the first clock signal $U_{K1}$ 337. The first switching circuit 352 is coupled to sample the feedback signal $U_2$ 309 during logic high pulses of the second clock signal $U_{K2}$ 339.

The variable gain amplifier 302 is coupled to receive the output of the first switching circuit 352 and the gain signal $U_{GAIN}$ 307. The variable gain amplifier 302 is coupled to vary a gain or amplification of the output of first switching circuit 352 in response to the gain signal $U_{GAIN}$ 307.

In one example, a voltage offset circuit 345 is also included between the output of the first switching circuit 352 and the input of the variable gain amplifier 302. In operation, the voltage offset circuit 345 can be coupled to explicitly introduce an offset voltage to low voltage values of the reference signal $U_1$ 303 as well as the feedback signal $U_2$ 309 when the output of the variable gain amplifier 302 is below a threshold to reduce the effects of random offsets of the single variable gain amplifier 302 to further guarantee proper operation down close to zero volts. In implementation, process variations can introduce a positive or negative offset, which is illustrated for explanation purposes in FIG. 3 by the dashed voltage source 338. For a positive offset 338, the input to the variable gain amplifier 302 is unaffected, as the auxiliary amplifier can adjust the gain signal $U_{GAIN}$ 307. However, when the magnitude of a negative offset 338 is greater than the reference signal $U_1$ 303 or the feedback signal $U_2$ 309, the variable gain amplifier 302 input could be at zero volts or negative voltage. Consequently, if the variable gain amplifier 302 received an input signal at zero volts, the gain signal $U_{GAIN}$ 307 required would be infinite. In another case, if the variable gain amplifier 302 received an input signal with a negative voltage, the output of the variable gain amplifier 302 would provide an output corresponding to the lowest rail supply voltage.

In order to prevent the aforementioned scenarios, the voltage offset circuit 345 provides a positive offset voltage 355 to the output of the first switching circuit 352 when the output of the variable gain amplifier $U_{VGA}$ 360 is below a threshold $V_{THR}$ 353 by opening switch S5 343 and closing switch S6 351. In one example, the threshold $V_{THR}$ 353 can be 1.5 volts. If the output of the variable gain amplifier $U_{VGA}$ 360 is above the threshold $V_{THR}$ 353, no additional offset voltage 355 is required, and the offset circuit closes switch S5 343 and opens switch S6 351. In so doing, the single variable gain amplifier 302 can therefore remain operating in the high gain region of operation; even when the reference signal $U_1$ 303 and the feedback signal $U_2$ 309 are close to zero volts in accordance with the teachings of the present invention.

Continuing with the depicted example, a second switching circuit 354 has an input coupled to receive an output of the variable gain amplifier 302, the first clock signal $U_{K1}$ 337, and the second clock signal $U_{K2}$ 339. A first output of the second switching circuit 354 is coupled to output the first adjusted signal $U_{1A}$ 305 during logic high pulses of the first clock signal $U_{K1}$ 337, and a second output of the second switching circuit 354 is coupled to output the second adjusted signal $U_{2A}$ 311 during logic high pulses of the second clock signal $U_{K2}$ 339. A storage element 348 is coupled to the first output of the second switching circuit 354 to store the first adjusted signal $U_{1A}$ 305 at the first output of the second switching circuit 354. In one example, the storage element 348 includes a capacitor C1 to store the voltage of the first adjusted signal $U_{1A}$ 305, which is output by the second switching circuit 354 during the logic high pulses of first clock signal $U_{K1}$ 337.

As shown in the depicted example, a comparator circuit 308 included in the controller is coupled the variable gain circuit 312 in the signal amplifier 301 to compare the first adjusted signal $U_{1A}$ 305 to the second adjusted signal $U_{2A}$ 311 to output a switch request event $U_{CC}$ 313. In particular, comparator circuit 308 is coupled to the storage element 348 and the second output of the second switching circuit 354 to output a switch request event $U_{CC}$ 313, which will be received by a switch request circuit of the power converter in response to a comparison of the first adjusted signal $U_{1A}$ 305 to the second adjusted signal $U_{2A}$ 311 at the end logic high pulses of the second clock signal $U_{K2}$ 339.

As shown in the example depicted in FIG. 3, a flip-flop 350 is coupled to an output of the comparator circuit 308 to latch the switch request event $U_{CC}$ 313 from the comparator circuit 308 in response to the second clock signal $U_{K2}$ 339. In one example, an inverter 349 is coupled to the clock input of flip-flop 350 such that flip-flop 350 is coupled to latch the switch request event $U_{CC}$ 313 from the comparator circuit 308 in response to an inverted second clock signal $U_{K2}$ 339. Thus, in one example, the flip-flop 350 is coupled to latch the switch request event $U_{CC}$ 313 in response to a falling edge of the second clock signal $U_{K2}$ 339.

Figure 4:
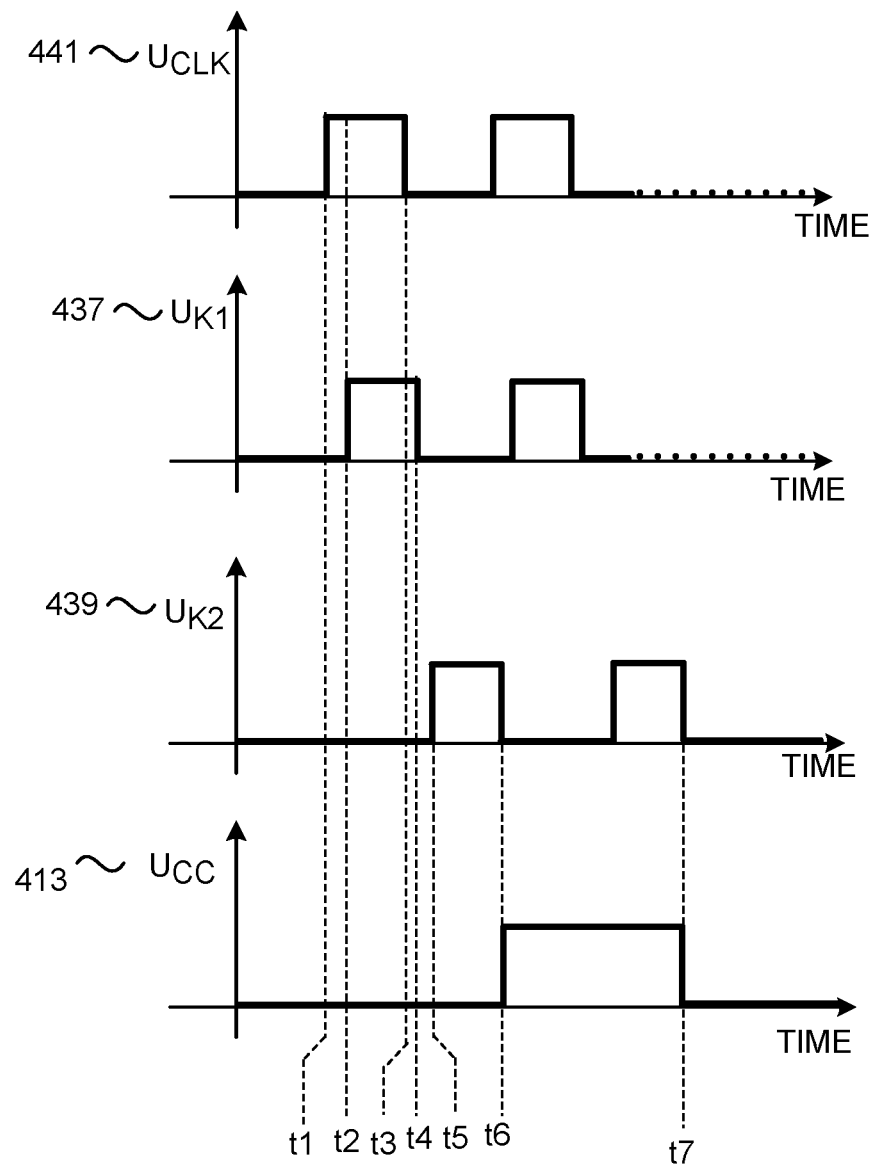
FIG. 4 is a timing diagram illustrating various example waveform pulses found in the example signal amplifier of FIG. 3 in accordance with an embodiment of the disclosure.

To illustrate, FIG. 4 is a timing diagram illustrating various example waveform pulses found in the example signal amplifier 301 of FIG. 3 in accordance with an embodiment of the disclosure. Therefore, it is appreciated that similarly named and numbered elements referenced below may be coupled and function similar to as described above. As shown in FIG. 4, the rising edge of a logic high pulse of $U_{CLK}$ 441 begins at time t1. A logic high pulse of first clock signal $U_{K1}$ 437 occurs at time t2. At time t3, the falling edge of the logic high pulse of the clock signal $U_{CLK}$ 441 occurs, which causes the falling edge of first clock signal $U_{K1}$ 437 to occur at time t4. After a dead time between time t4 and time t5, a rising edge of second clock signal $U_{K2}$ 439 occurs at time t5. At time t6, the falling edge of second clock signal $U_{K2}$ 439 occurs, which causes the rising edge of the switch request event $U_{CC}$ 413 to occur also at time t6 in response to the falling edge of second clock signal $U_{K2}$ 439. A dead time exists after time t6 between the first clock signal $U_{K1}$ 437 and the second clock signal $U_{K2}$ 439. At time t7, the falling edge of second clock signal $U_{K2}$ 439 occurs, which causes the switch request event $U_{CC}$ 413 to transition to a logic low.

As mentioned previously, FIG. 5 is a schematic illustrating one example of a power converter 500 including a controller 595 with a signal amplifier 501 and a comparator circuit 508 that are coupled to provide a constant current $I_O$ 570 output to a load 568 in accordance with the teachings of the present disclosure. It is appreciated that signal amplifier 501 of FIG. 5 may be an example of the signal amplifier 301 of FIG. 3, or the signal amplifier 101 of FIG. 1, and that similarly named and numbered elements referenced below may be coupled and function similar to as described above.

Figure 5:
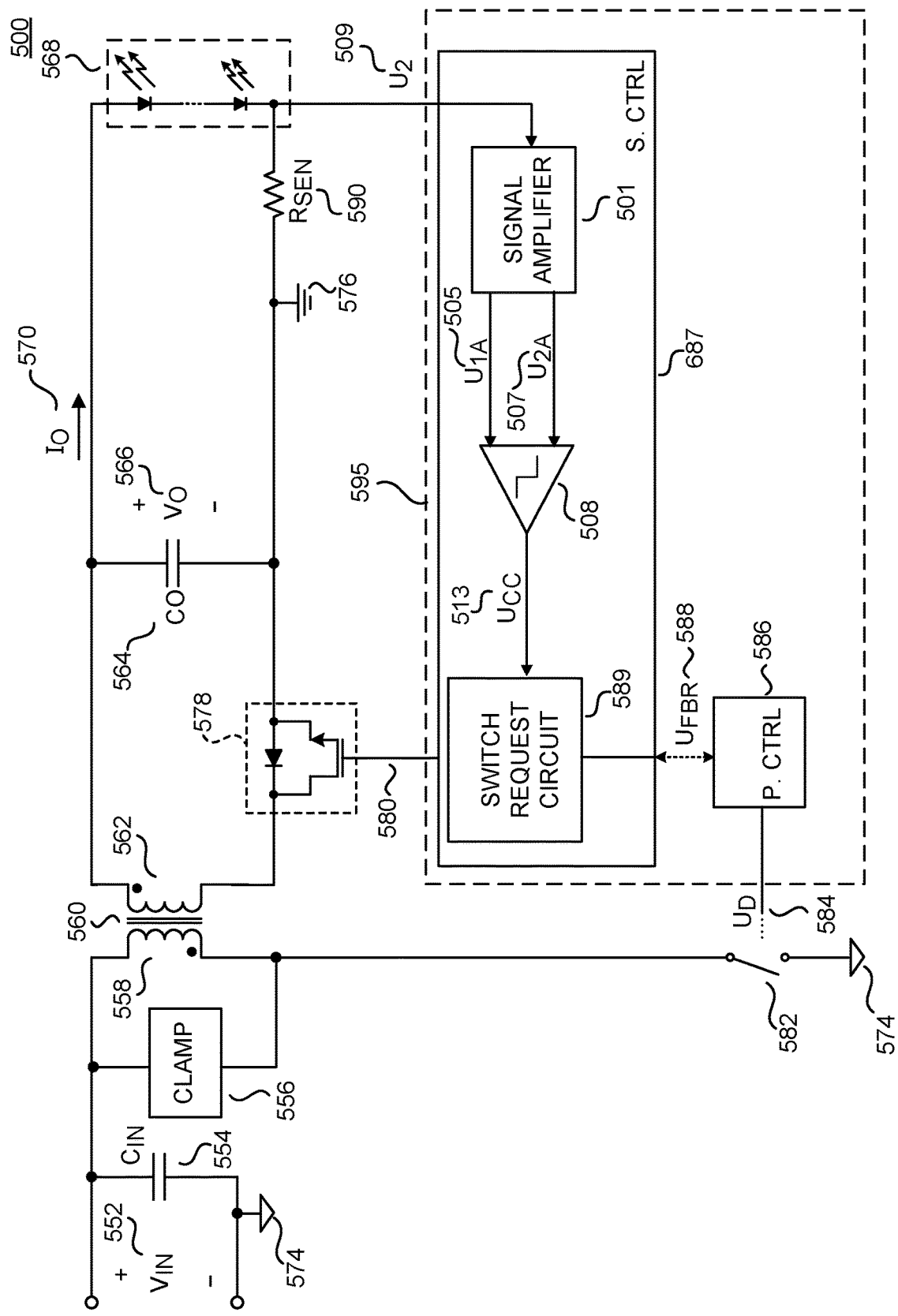
FIG. 5 is a schematic illustrating one example of a power converter including a controller with a signal amplifier and a comparator circuit coupled to provide a constant current output to a load in accordance with an embodiment of the disclosure.

As illustrated in the example depicted in FIG. 5, power converter 500 includes an energy transfer element 560 coupled between an input and an output of power converter 500. In the depicted example, power converter 500 is configured in a flyback topology for explanation purposes, but it is appreciated that other power converter topologies may also benefit from the teachings of the present invention. As shown in the depicted example, the input of energy transfer element 560 includes a primary winding 558 coupled to a power switch 582, which is coupled to a primary side ground 574. The primary winding 558 is also coupled to an input capacitor $C_{IN}$ 554 to receive an input voltage $V_{IN}$ 552. A clamp circuit 556 is coupled across the primary winding 558 of energy transfer element 560 to clamp the voltage to which power switch 582 is exposed. The output of energy transfer element 560 includes a secondary winding 562, which is coupled to an output capacitor $C_O$ 564 coupled to a secondary ground 576 and a rectifier circuit 578.

In the depicted example, the output of power converter 500 is galvanically isolated from the input of power converter 500 such that there is no direct current (dc) path between primary ground 574 and secondary ground 576. In the depicted example, the rectifier circuit 578 is implemented with a synchronous rectifier that is controlled with a synchronous rectifier control signal 580. It is appreciated that in other examples, other circuits, such as for example a diode circuit, may be utilized to implement rectifier circuit 578.

The example shown in FIG. 5 also illustrates that a load 568, such as for example a string of light emitting diodes (LEDs), is coupled to the output of power converter 500 to receive a constant current (CC) $I_O$ 570 from power converter 500. In the illustrated example, it is appreciated that the brightness of the LED load 568 is controlled with the constant current $I_O$ 570 provided by the output of power converter 500. For dimmer lighting conditions from the LED load 568, a smaller constant current $I_O$ 570 is provided by power converter 500, and for brighter lighting conditions from the LED load 568, a larger constant current $I_O$ 570 is provided by power converter 500.

In order to regulate the constant current $I_O$ 570 provided to load 568, a controller 595 is included in power converter 500, and is coupled to generate a drive signal $U_D$ 584 to control switching of the power switch 582, which controls the transfer of energy from the input of power converter 500 to the load 568 in response to a feedback signal $U_2$ 509. In the depicted example, the feedback signal $U_2$ 509 is representative of the output of power converter 500, and is generated across a sense resistor $R_{SEN}$ 590, which is coupled between the secondary ground 576 and the load 568. In one example, the feedback signal $U_2$ 509 is representative of the current $I_O$ 570 through load 568.

As shown in the depicted example, controller 595 includes a secondary controller 587 and a primary controller 586. In the example, secondary controller 587 is coupled to receive the feedback signal $U_2$ 509, which is representative of the output of the power converter 500, to generate the synchronous rectifier control signal 580 to control switching of the synchronous rectifier. In the example, the secondary controller 587 also generates a feedback request signal $U_{FBR}$ 588, which the primary controller receives to generate the drive signal $U_D$ 584 to control switching of the power switch 582 to control the transfer of energy from the input to the output of power converter 500.

In the example depicted in FIG. 5, a signal amplifier 501 is coupled to receive the feedback signal $U_2$ 509, and is coupled to generate a first adjusted signal $U_{1A}$ 505 and a second adjusted signal $U_{2A}$ 507, as discussed in detail above in FIGS. 1-4. Comparator circuit 508 is coupled to compare the first adjusted signal $U_{1A}$ 505 and the second adjusted signal $U_{2A}$ 507 to generate the switch request signal $U_{CC}$ 513, which is coupled to be received by a switch request circuit 589. In one example, the switch request circuit 589 is coupled to generate the synchronous rectifier control signal 580 and the feedback request signal $U_{FBR}$ 588 to regulate the constant current $I_O$ 570 is provided to the load 568. In the example, synchronous rectifier control signal 580 controls switching of the synchronous rectifier in rectifier circuit 578, and the feedback request signal $U_{FBR}$ 588 is received by the primary controller 586 to generate the drive signal $U_D$ 584 to control switching of the power switch 582 in accordance with the teachings of the present invention. In one example, the feedback request signal $U_{FBR}$ 588 may be received by the primary controller 586 form the secondary controller 587 through a magnetic or optical communication link such that the galvanic isolation between the input and output of the power converter 500 is maintained in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A signal amplifier for use in a power converter, comprising:
    a variable reference generator coupled to generate a reference signal in response to a dimming control signal;
    a variable gain circuit coupled to receive the reference signal, a gain signal, and a feedback signal representative of an output of the power converter, wherein the variable gain circuit is coupled to output a first adjusted signal in response to the reference signal and the gain signal, and wherein the variable gain circuit is coupled to output a second adjusted signal in response to the feedback signal and the gain signal; and
    an auxiliary amplifier coupled to output the gain signal in response to the first adjusted signal and a set signal.

2. The signal amplifier of claim 1, wherein the variable gain circuit comprises:
    a first variable gain amplifier coupled to receive the reference signal and the gain signal, wherein the first variable gain amplifier is coupled to vary a first gain of the reference signal in response to the gain signal to output the first adjusted signal; and
    a second variable gain amplifier coupled to receive the feedback signal and the gain signal, wherein the second variable gain amplifier is coupled to vary a second gain of the feedback signal in response to the gain signal to output the second adjusted signal.

3. The signal amplifier of claim 1, wherein the variable gain circuit comprises:
    a first operational amplifier having a first input coupled to receive the reference signal, and an output coupled to generate the first adjusted signal;
    a first voltage divider including a first resistor coupled to a second resistor, wherein a first end of the first resistor is coupled to the output of the first operational amplifier, wherein a second end of the first resistor is coupled to a second input of the first operational amplifier, wherein a first resistance ratio of the first resistor and the second resistor is coupled to be adjusted in response to the gain signal to vary a first gain of the first operational amplifier;
    a second operational amplifier having a first input coupled to receive the feedback signal, and an output coupled to generate the second adjusted signal; and
    a second voltage divider including a third resistor coupled to a fourth resistor, wherein a first end of the third resistor is coupled to the output of the second operational amplifier, wherein a second end of the third resistor is coupled to a second input of the second operational amplifier, wherein a second resistance ratio of the third resistor and the fourth resistor is coupled to be adjusted in response to the gain signal to vary a second gain of the second operational amplifier.

4. The signal amplifier of claim 1, wherein the variable reference generator comprises:
    a first current source coupled to provide a first reference current;
    a variable current source coupled to the first current source to shunt a variable current from the first reference current in response to the dimming control signal; and
    a reference resistor coupled to the first current source and the variable current source to generate the reference signal in response to a difference between the first reference current and the variable current.

5. The signal amplifier of claim 1, wherein a comparator circuit is coupled to compare the first adjusted signal to the second adjusted signal to output a switch request event to a switch request circuit of the power converter in response to a comparison of the first adjusted signal to the second adjusted signal.

6. The signal amplifier of claim 1, wherein variable gain circuit comprises:
    a nonoverlapping clock generator coupled to generate a first clock signal and a second clock signal, wherein logic high pulses of the first clock signal and logic high pulses of the second clock signals are nonoverlapping;
    a first switching circuit coupled to receive the reference signal, the first clock signal, the feedback signal, and the second clock signal, wherein an output of the first switching circuit is coupled to output the reference signal during logic high pulses of the first clock signal, and wherein the output of the first switching circuit is coupled to output the feedback signal during logic high pulses of the second clock signal;

a variable gain amplifier having an input coupled receive the output of the first switching circuit and the gain signal, wherein the variable gain amplifier is coupled to vary a gain of the output of first switching circuit in response to the gain signal;

a second switching circuit having an input coupled to receive an output of the variable gain amplifier, the first clock signal, and the second clock signal, wherein a first output of the second switching circuit is coupled to output the first adjusted signal during logic high pulses of the first clock signal, and wherein a second output of the second switching circuit is coupled to output the second adjusted signal during logic high pulses of the second clock signal; and a storage element coupled to the first output of the second switching circuit to store the first adjusted signal at the first output of the second switching circuit.

7. The signal amplifier of claim 6, further comprising a voltage offset circuit coupled between the output of the first switching circuit and the input of the variable gain amplifier.

8. The signal amplifier of claim 7, wherein the voltage offset circuit is coupled to provide an offset to the output of the first switching circuit when an output of the variable gain amplifier circuit is below a threshold.

9. The signal amplifier of claim 6, wherein the storage element comprises a capacitor coupled to the first output of the second switching circuit to store the first adjusted signal at the first output of the second switching circuit.

10. The signal amplifier of claim 6, wherein a comparator circuit is coupled to the storage element and the second output of the second switching circuit to output a switch request event to a switch request circuit of the power converter in response to a comparison of the first adjusted signal to the second adjusted signal during the logic high pulses of the second clock signal.

11. The signal amplifier of claim 10, wherein a flip-flop is coupled to an output of the comparator circuit to latch the switch request event from the comparator circuit in response to the second clock signal.

12. The signal amplifier of claim 11, wherein the flip-flop is coupled to latch the switch request event from the comparator circuit in response to an inverted second clock signal.

13. A power converter, comprising:
an energy transfer element coupled between a power converter input and a power converter output;
a power switch coupled to an input of the energy transfer element and the power converter input; and
a controller coupled to generate a drive signal coupled to control switching of the power switch to control a transfer of energy from the power converter input to a load coupled to the power converter output in response to a feedback signal representative of the power converter output, wherein the controller is coupled to regulate a constant load current to the load coupled to the power converter output, wherein the controller comprises:
  a signal amplifier coupled to receive the feedback signal, and coupled to generate a first adjusted signal and a second adjusted signal, wherein the signal amplifier comprises:
    a variable reference generator coupled to generate a reference signal in response to a dimming control signal;
    a variable gain circuit coupled to receive the reference signal, the gain signal, and the feedback signal, wherein the variable gain circuit is coupled to output the first adjusted signal in response to the reference signal and the gain signal, and wherein the variable gain circuit is coupled to output the second adjusted signal in response to the feedback signal and the gain signal; and
    an auxiliary amplifier coupled to output the gain signal in response to the first adjusted signal and a set signal;
  a comparator circuit coupled to compare the first adjusted signal to the second adjusted signal to output a switch request event; and
  a switch request circuit coupled to receive the switch request event from the comparator circuit to control switching of a synchronous rectifier coupled to the output of the power converter; and
a primary controller circuit coupled to receive a feedback request signal from the switch request circuit to generate the drive signal to control switching of the power switch.

14. The power converter of claim 13, wherein the variable gain circuit comprises:
a first variable gain amplifier coupled to receive the reference signal and the gain signal, wherein the first variable gain amplifier is coupled to vary a first gain of the reference signal in response to the gain signal to output the first adjusted signal; and
a second variable gain amplifier coupled to receive the feedback signal and the gain signal, wherein the second variable gain amplifier is coupled to vary a second gain of the feedback signal in response to the gain signal to output the second adjusted signal.

15. The power converter of claim 13, wherein the variable gain circuit comprises:
a first operational amplifier having a first input coupled to receive the reference signal, and an output coupled to generate the first adjusted signal;
a first voltage divider including a first resistor coupled to a second resistor, wherein a first end of the first resistor is coupled to the output of the first operational amplifier, wherein a second end of the first resistor is coupled to a second input of the first operational amplifier, wherein a first resistance ratio of the first resistor and the second resistor is coupled to be adjusted in response to the gain signal to vary a first gain of the first operational amplifier;
a second operational amplifier having a first input coupled to receive the feedback signal, and an output coupled to generate the second adjusted signal; and
a second voltage divider including a third resistor coupled to a fourth resistor, wherein a first end of the third resistor is coupled to the output of the second operational amplifier, wherein a second end of the third resistor is coupled to a second input of the second operational amplifier, wherein a second resistance ratio of the third resistor and the fourth resistor is coupled to be adjusted in response to the gain signal to vary a second gain of the second operational amplifier.

16. The power converter of claim 13, wherein the variable reference generator comprises:
a first current source coupled to provide a first reference current;

a variable current source coupled to the first current source to shunt a variable current from the first reference current in response to the dimming control signal; and a reference resistor coupled to the first current source and the variable current source to generate the reference signal in response to a difference between the first reference current and the variable current.

17. The power converter of claim 13, wherein variable gain circuit comprises:

a nonoverlapping clock generator coupled to generate a first clock signal and a second clock signal, wherein logic high pulses of the first clock signal and logic high pulses of the second clock signals are nonoverlapping;

a first switching circuit coupled to receive the reference signal, the first clock signal, the feedback signal, and the second clock signal, wherein an output of the first switching circuit is coupled to output the reference signal during logic high pulses of the first clock signal, and wherein the output of the first switching circuit is coupled to output the feedback signal during logic high pulses of the second clock signal;

a variable gain amplifier having an input coupled receive the output of the first switching circuit and the gain signal, wherein the variable gain amplifier is coupled to vary a gain of the output of first switching circuit in response to the gain signal;

a second switching circuit having an input coupled to receive an output of the variable gain amplifier, the first clock signal, and the second clock signal, wherein a first output of the second switching circuit is coupled to output the first adjusted signal during logic high pulses of the first clock signal, and wherein a second output of the second switching circuit is coupled to output the second adjusted signal during logic high pulses of the second clock signal; and a storage element coupled to the first output of the second switching circuit to store the first adjusted signal at the first output of the second switching circuit.

18. The power converter of claim 17, further comprising a voltage offset circuit coupled between the output of the first switching circuit and the input of the variable gain amplifier.

19. The power converter of claim 18, wherein the voltage offset circuit is coupled to provide an offset to the output of the first switching circuit when an output of the variable gain amplifier circuit is below a threshold.

20. The power converter of claim 17, wherein the storage element comprises a capacitor coupled to the first output of the second switching circuit to store the first adjusted signal at the first output of the second switching circuit.

21. The power converter of claim 17, wherein the comparator circuit is coupled to the storage element and the second output of the second switching circuit to output the switch request event in response to a comparison of the first adjusted signal to the second adjusted signal during the logic high pulses of the second clock signal.

22. The signal amplifier of claim 21, wherein a flip-flop is coupled between an output of the comparator circuit and the switch request circuit to latch the switch request event from the comparator circuit in response to the second clock signal.

* * * * *